(12) United States Patent
Sheng et al.

(10) Patent No.: US 11,024,534 B2
(45) Date of Patent: Jun. 1, 2021

(54) SEMICONDUCTOR DEVICE HAVING OPENING AND VIA HOLE AND METHOD FOR MANUFACTURING THE SAME

(71) Applicant: Wuhan Xinxin Semiconductor Manufacturing Co., Ltd., Hubei (CN)

(72) Inventors: Beibei Sheng, Hubei (CN); Sheng Hu, Hubei (CN)

(73) Assignee: Wuhan Xinxin Semiconductor Manufacturing Co., Ltd., Hubei (CN)

( * ) Notice: Subject to any disclaimer, the term of this patent is extended or adjusted under 35 U.S.C. 154(b) by 0 days.

(21) Appl. No.: 16/581,010

(22) Filed: Sep. 24, 2019

(65) Prior Publication Data
US 2020/0411368 A1 Dec. 31, 2020

(30) Foreign Application Priority Data
Jun. 25, 2019 (CN) .......................... 201910554804.9

(51) Int. Cl.
*H01L 21/768* (2006.01)
*H01L 23/522* (2006.01)

(52) U.S. Cl.
CPC .... *H01L 21/76816* (2013.01); *H01L 21/7684* (2013.01); *H01L 21/7685* (2013.01); *H01L 21/76877* (2013.01); *H01L 23/5226* (2013.01)

(58) Field of Classification Search
CPC .......... H01L 21/76816; H01L 21/7684; H01L 21/7685; H01L 21/76877; H01L 23/5226
See application file for complete search history.

(56) References Cited

U.S. PATENT DOCUMENTS 9,285,673 B2   3/2016  Huang et al.
9,557,649 B2   1/2017  Huang et al.
(Continued)

FOREIGN PATENT DOCUMENTS

| CN | 105319832 A | 2/2016 |
|---|---|---|
| CN | 109891582 A | 6/2019 |
| WO | WO-2018153872 A1 | 8/2018 |

OTHER PUBLICATIONS

First Chinese Office Action regarding Application No. 201910554804.9 dated Jun. 29, 2020. English translation provided by Unitalen Attorneys at Law.

*Primary Examiner* — Lex H Malsawma
(74) *Attorney, Agent, or Firm* — Harness, Dickey & Pierce, P.L.C.

(57) ABSTRACT

A semiconductor device and a method for manufacturing the same. When a pattern for etching is formed through photolithography after forming a photoresist layer on an adhesion layer, a sub-resolution auxiliary pattern of the mask is above the non-lead-out region, and an exposable pattern of the mask is above a lead-out region. In the photolithography, a first partial exposure region exposed partially in depth is formed in the photoresist layer corresponding to the sub-resolution auxiliary pattern, and an exposed pattern that is exposed completely is formed in the photoresist layer corresponding to the exposable pattern. After anisotropic etching on the adhesion layer through the photoresist layer, both an opening running through a partial thickness of the adhesion layer and a via hole running through the adhesion layer are formed. The opening balances a load in planarization during a process of filling the via hole.

12 Claims, 7 Drawing Sheets

(56) References Cited

U.S. PATENT DOCUMENTS

| | | |
|---|---|---|
| 10,141,391 B2 | 11/2018 | Yang |
| 2010/0144155 A1* | 6/2010 | Yatsuda .............. H01L 21/0338 |
| | | 438/700 |
| 2016/0011501 A1 | 1/2016 | Huang et al. |
| 2016/0018727 A1* | 1/2016 | Kim ......................... G03F 1/26 |
| | | 438/694 |
| 2016/0195812 A1 | 7/2016 | Huang et al. |
| 2018/0240859 A1* | 8/2018 | Yang ................. H01L 23/53233 |

* cited by examiner

SEMICONDUCTOR DEVICE HAVING OPENING AND VIA HOLE AND METHOD FOR MANUFACTURING THE SAME

The present disclosure claims the priority to Chinese Patent Application No. 201910554804.9, titled "SEMICONDUCTOR DEVICE AND METHOD FOR MANUFACTURING THE SAME", filed on Jun. 25, 2019 with China National Intellectual Property Administration, the content of which is incorporated herein by reference.

FIELD

The present disclosure relates to the field of semiconductor devices and manufacture thereof, and particularly, to a semiconductor device and a method for manufacturing the semiconductor device.

BACKGROUND

Wafer bonding technology has been widely used with continuous development of semiconductor technology. In wafer bonding, two wafers are bonded together through bonding techniques, thereby achieving vertical interconnection between the two wafers.

Hybrid bonding is applied as a common manner of wafer bonding. In implementation, it is necessary to form a bonding pad for electrically leading out a top metal layer on the wafer. The bonding pad is disposed on a part of the wafer. A region in which the bonding pad is not formed may cause an unbalanced load in a process of chemical mechanical planarization. Thereby, a surface of the wafer is uneven, resulting in failure of a device.

SUMMARY

An objective of the present disclosure is to provide a semiconductor device and a method for manufacturing the semiconductor device, so as to balance a load balancing in a process of planarization and reduce manufacturing costs.

To achieve the above objective, following technical solutions are provided according to embodiments of the present disclosure.

A method for manufacturing a semiconductor device is provided, including: providing a substrate, forming a cover layer made of a dielectric material on the substrate, and forming a top wiring layer within the cover layer; forming an adhesion layer on the cover layer, where the adhesion layer includes a lead-out region and a non-lead-out region, and the lead-out region is located above the top wiring layer; forming a photoresist layer on the adhesion layer, and transferring a pattern of a mask to the photoresist layer through photolithography, where the pattern of the mask includes a first pattern and a second pattern, the first pattern is a sub-resolution auxiliary pattern and corresponds to the non-lead-out region, the second pattern is exposable and corresponds to the lead-out region, a first partial exposure region is formed in the photoresist layer above the non-lead-out region, the first partial exposure region is exposed partially in depth from the first pattern, and an exposed pattern of the second pattern is formed in the photoresist layer above the lead-out region; performing anisotropic etching on the adhesion layer by using the photoresist layer, to form both a first opening and a via hole in the adhesion layer, where the first opening is under the first partial exposure region and runs through a partial thickness of the adhesion layer, and the via hole is under the exposed pattern and runs through the adhesion layer to the top wiring layer; and filling the first opening and the via hole with a conductive material, where the conductive material is planarized.

Optionally, the pattern of the mask further includes a third pattern, where the third pattern is another sub-resolution auxiliary pattern and corresponds to the lead-out region, and the third pattern surrounds the second pattern. A second partial exposure region is further formed in the photoresist layer above the lead-out region in the photolithography, where the second partial exposure region is exposed partially in depth from the third pattern. A second opening is further formed in performing the anisotropic etching on the adhesion layer, where the second opening is under the second partial exposure region and runs through another partial thickness of the adhesion layer.

Optionally, an arrangement of the first pattern or the third pattern includes at least one of a lattice structure, a strip structure, a nested structure, or a crisscross structure.

Optionally, a quantity of the second pattern is more than one.

Optionally, the adhesion layer includes at least one of a silicon oxide layer, an NDC layer, or a lamination of a silicon oxide layer and an NDC layer.

A semiconductor device is provided, including a substrate, a top wiring layer, a cover layer, an adhesion layer, a first non-lead-out layer, and a lead-out hole. The cover layer is on the substrate and made of a dielectric material. The top wiring layer is within the cover layer. The adhesion layer is on the cover layer, and includes a lead-out region and a non-lead-out region, where the lead-out region is located above the top wiring layer. The first non-lead-out layer is located within the adhesion layer at the non-lead out region, the first non-lead-out layer is smaller than the adhesion layer in thickness, and the first non-lead-out layer includes a first opening and a conductive material in the first opening. The lead-out hole is in the adhesion layer and runs through the lead-out region, and the lead-out hole includes a via hole and a conductive material in the via hole, where the via hole runs through the lead-out region to the top wiring layer.

Optionally, the semiconductor device further includes a second non-lead-out layer located within the adhesion layer at the lead out region, where the second non-lead-out layer is smaller than the adhesion layer in thickness, the second non-lead-out layer includes a second opening and a conductive material in the second opening, and the second opening surrounds the via hole.

Optionally, a quantity of the via hole is more than one.

Optionally, the adhesion layer includes at least one of a silicon oxide layer, an NDC layer, or a lamination of a silicon oxide layer and an NDC layer.

A mask is provided, applied to photolithography for forming a via hole for leading out a top wiring layer. A pattern of the mask includes a first pattern and a second pattern. The first pattern is a sub-resolution auxiliary pattern and corresponds to a non-lead-out region, the second pattern is exposable and corresponds to a lead-out region, and the lead-out region corresponds to a region in which the top wiring layer is located.

Optionally, the pattern of the mask further includes a third pattern, where the third pattern is another sub-resolution auxiliary pattern and corresponds to the lead-out region, and the third pattern surrounds the second pattern.

Optionally, an arrangement of the first pattern or the third pattern includes at least one of a lattice structure, a strip structure, a nested structure, or a crisscross structure.

The semiconductor device and the method for manufacturing the semiconductor device are provided according to embodiments of the present disclosure. When the pattern for etching is formed through the photolithography after forming the photoresist layer on the adhesion layer, the sub-resolution auxiliary pattern of the mask is above the non-lead-out region, and the exposable pattern of the mask is above the lead-out region. Thereby in the photolithography, the first partial exposure region exposed partially in depth is formed in the photoresist layer corresponding to the sub-resolution auxiliary pattern, and the exposed pattern that is exposed completely is formed in the photoresist layer corresponding to the exposable pattern. After the anisotropic etching on the adhesion layer through the photoresist layer, both the opening running through the partial thickness of the adhesion layer and the via hole running through the adhesion layer are formed. In such case, both the opening and the via hole are formed in the same etching process. The opening is configured to balance a load in planarization during a process of filling the via hole. Thereby, a load balance during the planarization is achieved, and a cost of manufacturing is reduced.

BRIEF DESCRIPTION OF THE DRAWINGS

For clearer illustration of the technical solutions according to embodiments of the present disclosure or conventional techniques, hereinafter are briefly described the drawings to be applied in embodiments of the present disclosure or conventional techniques. Apparently, the drawings in the following descriptions are only some embodiments of the present disclosure, and other drawings may be obtained by those skilled in the art based on the provided drawings without creative efforts.

DETAILED DESCRIPTION

For better understanding of the above objects, features and advantages of the present disclosure, hereinafter specific embodiments of the present disclosure are described in detail in conjunction with the drawings.

Many specific details are illustrated in following description to facilitate a full understanding of the present disclosure. The present disclosure may be practiced in another manner besides those described herein. Those skilled in the art can analogize without departing from the scope of the present disclosure. Therefore, the present disclosure is not limited to specific embodiments disclosed hereinafter.

The present disclosure is described in detail in conjunction with the drawings. To facilitate description in describing embodiments of the present disclosure in detail, a sectional view showing a structure of a device is not partially enlarged on a general scale. The schematic diagram is merely exemplary, and the protection scope of present disclosure should not be limited thereto. In addition, the three-dimensional spatial dimensions of length, width and depth should be included in practical manufacture.

Unbalanced load in a process of chemical mechanical planarization results in an uneven surface of a wafer and thereby failure of a device. In view of the above, a semiconductor device and a method for manufacturing the semiconductor device are provided according to embodiments of the present disclosure. When a pattern for etching is formed through photolithography after forming a photoresist layer on an adhesion layer, a sub-resolution auxiliary pattern of a mask is above a non-lead-out region, and an exposable pattern of the mask is above a lead-out region. Thereby in the photolithography, a first partial exposure region exposed partially in depth is formed in the photoresist layer corresponding to the sub-resolution auxiliary pattern, and an exposed pattern that is exposed completely is formed in the photoresist layer corresponding to the exposable pattern. After anisotropic etching on the adhesion layer through the photoresist layer, both an opening running through a partial thickness of the adhesion layer and a via hole running through the adhesion layer are formed. In such case, both the opening and the via hole are formed in the same etching process. The opening is configured to balance a load in planarization during a process of filling the via hole. Thereby, a load balance during the planarization is achieved, and a cost of manufacturing is reduced.

For better understanding the technical solutions and technical effects of the present disclosure, hereinafter embodiments are described in detail in conjunction with a flowchart in FIG. 1 and FIGS. 2 to 9.

Figure 1:
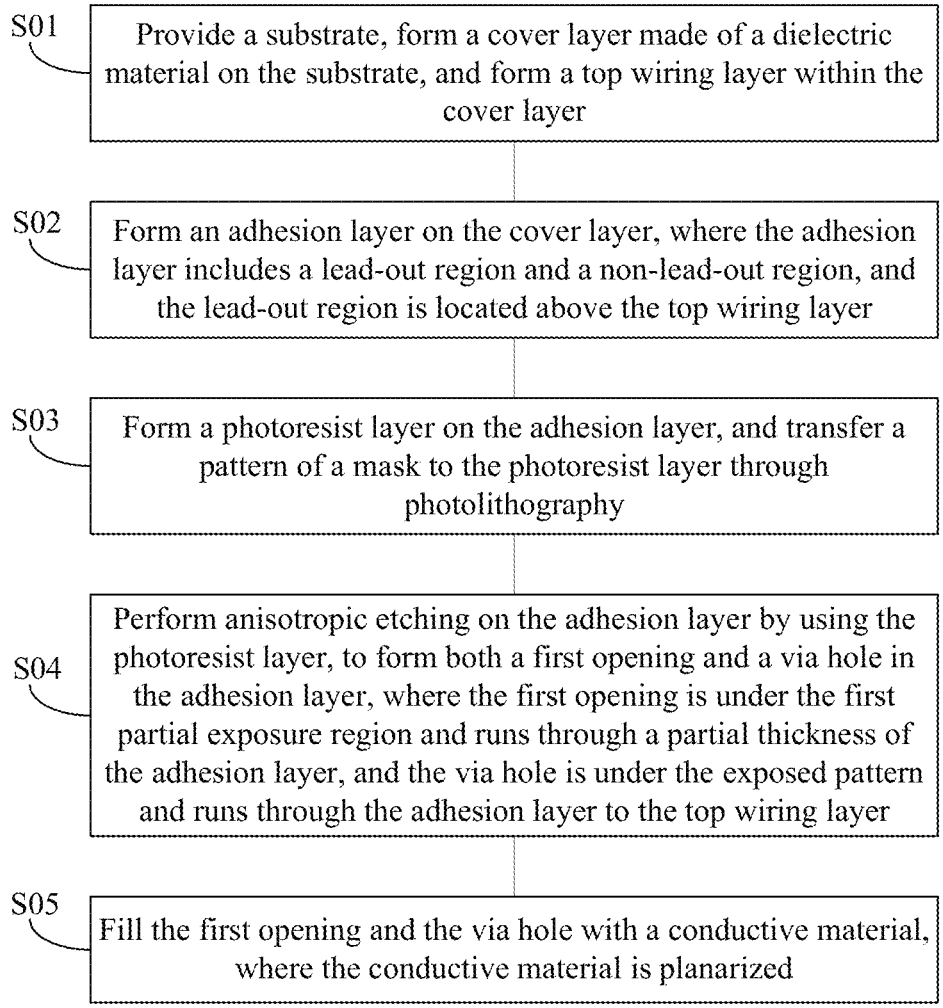
FIG. 1 is a flow chart of a method for manufacturing a semiconductor device according to an embodiment of the present disclosure.
Figure 2:
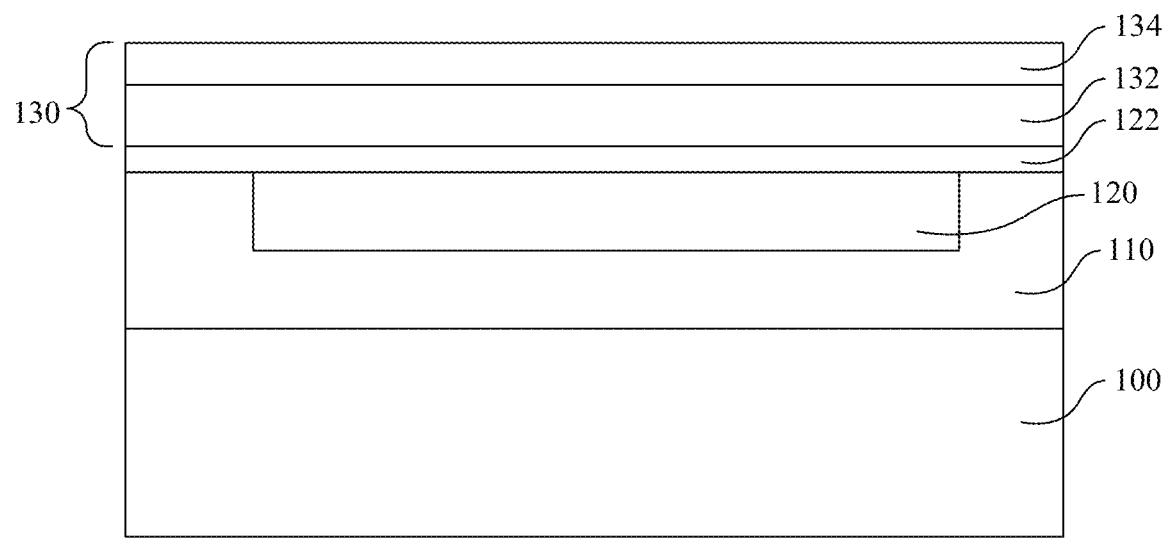
FIGS. 2 to 9 are schematic structural diagrams in a process of a method for manufacturing a semiconductor device according to an embodiment of the present disclosure.

Reference is made to FIG. 1. In step S01, a substrate 100 is provided, a cover layer 110 made of a dielectric material is formed on the substrate 100, and a top wiring layer 120 is formed within the cover layer 110, as shown in FIG. 2.

In one embodiment, the substrate 100 is a semiconductor substrate, for example, a Si substrate, a Ge substrate, a SiGe substrate, an SOI (silicon on insulator), or a GOI (germanium on insulator). In another embodiment, the substrate 100 may be a substrate including another elemental semiconductor or another compound semiconductor, such as GaAs, InP, or SiC. The substrate 100 may be a stacked structure, such as Si/SiGe. The substrate 100 may be another epitaxial structure, such as SGOI (silicon-germanium on insulator). In this embodiment, the substrate 100 may be a silicon substrate.

In one embodiment, all processes for processing a device may have been completed, and a necessary device structure and an interconnection layer for electrically connecting the device structure have been formed on the substrate 100. The device structure may be covered by a dielectric layer. The dielectric layer may be a stacked structure, including an interlayer dielectric layer, an inter-metal dielectric layer, a bonding layer, and the like. The interconnection layer may be formed in the dielectric layer. The device structure may be a MOS device, a memory device, and/or other passive devices. The memory device may include a non-volatile memory, a random memory, or the like. The non-volatile memory may include, for example, a floating gate FET such as a NOR flash memory or a NAND flash memory, a ferroelectric memory, or a phase change memory. The device structure may be a planar device or a stereo device. The stereo device may be, for example, a fin-FET (fin field effect transistor), a three-dimensional memory, or the like. The interconnection layer includes a contact plug, a through-hole, a metal layer, or the like. The interconnection layer may include one or more layers. The interconnection layer may be made of metal such as tungsten, aluminum, copper, or the like. In the drawings for embodiments of the present disclosure, only the top wiring layer 120 in the interconnection structure is illustrated for conciseness. It can be understood that it is only exemplary herein, and a necessary quantity of interconnection layers may be formed on requirement in different designs and applications.

In one embodiment, the top wiring layer 120 is a topmost interconnection layer before forming a bonding pad. In some applications, the top wiring layer 120 is also called a top metal. The cover layer 110 is a dielectric material for isolating the top wiring layer 120, and may be a structure of one or more layers. In one embodiment, the cover layer 110 may be a stacked structure, and may include a silicon nitride layer and a silicon oxide layer on the silicon nitride layer. The silicon nitride layer may serve as a diffusion barrier layer, and the silicon oxide layer may be made of FSG (fluorinated silicate glass).

The top wiring layer 120 is formed in the cover layer 110, and may be made of metal such as copper. In one embodiment, a diffusion barrier layer 122 may be disposed on the cover layer 110. The diffusion barrier layer 122 covers the cover layer 110 and the top wiring layer 120, and can avoid sputtering and diffusion of the top wiring layer 120 that is made of metal during the etching process. A material of the diffusion barrier layer 122 may be, for example, silicon nitride.

In step S02, an adhesion layer 130 is formed on the cover layer 110 and the top wiring layer 120. The adhesion layer 130 includes a lead-out region 1302 and a non-lead-out region 1301, and the lead-out region 1302 is located above the top wiring layer 120, as shown in FIG. 2.

The adhesion layer 130 is a material for bonding. The adhesion layer 130 may be a single layer or a stacked structure. A material of the adhesion layer 130 may include, for example, bonding oxide, bonding nitride, NDC (nitrogen doped silicon carbide), or a combination thereof. In one embodiment as shown in FIG. 2, the adhesion layer 130 is a stacked structure, including a first adhesion layer 132 made of bonding oxide and a second adhesion layer 134 made of NDC on the first adhesion layer 132. In addition, a protective layer (not shown in the figure) may be formed on the adhesion layer 130. The protective layer is configured to prevent the adhesion layer 130 from being damaged, in subsequently forming an electrical lead-out structure on the top wiring layer 120. The protective layer may be made of, for example, silicon oxide.

The adhesion layer 130 includes the lead-out region 1302 and the non-lead-out region 1301. The lead-out region 1320 is located above the top wiring layer 120, and is a region for forming the electrical lead-out structure for the top wiring layer 120. The lead-out structure for the interconnection layer is not formed above the non-lead-out region 1301. In a case that the non-lead-out region 1301 is remained as a blank region in forming the electrical lead-out structure of the top wiring layer 120, a load in the CMP (chemical mechanical polishing) may be unbalanced during planarization. As a result, there is a defect in the CMP, and a surface of a wafer is uneven, thereby causing failure of a device. Therefore, it is necessary to introduce a dummy structure on the non-lead-out region 1301 to balance the load in the CMP. In a specific application, the non-lead-out region 1301 may be disposed at any location on requirement. For example, the non-lead-out region 1301 may be located above a part of the top wiring layer 120 or another region.

Figure 3:
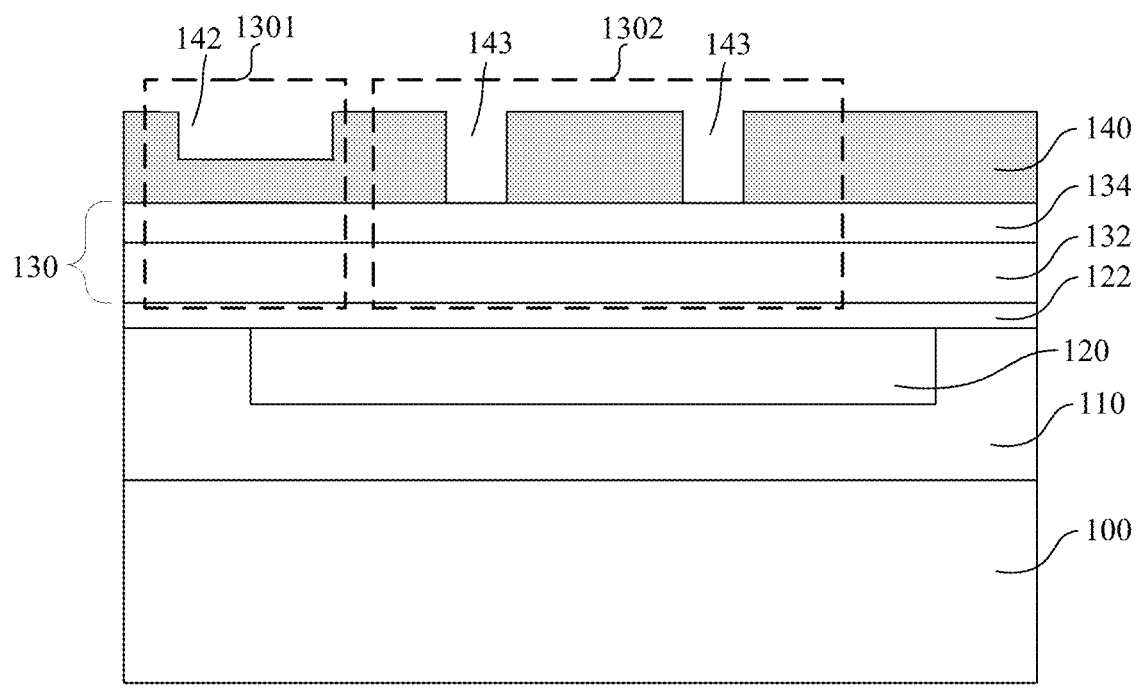
Figure 4:
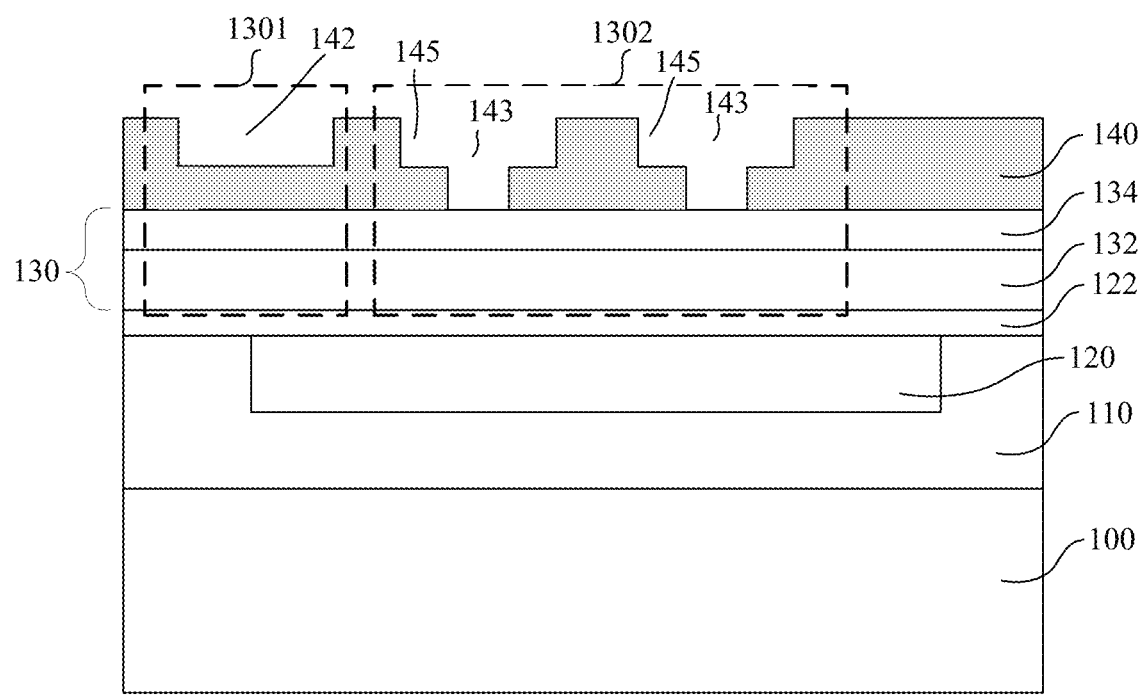
Figure 5:
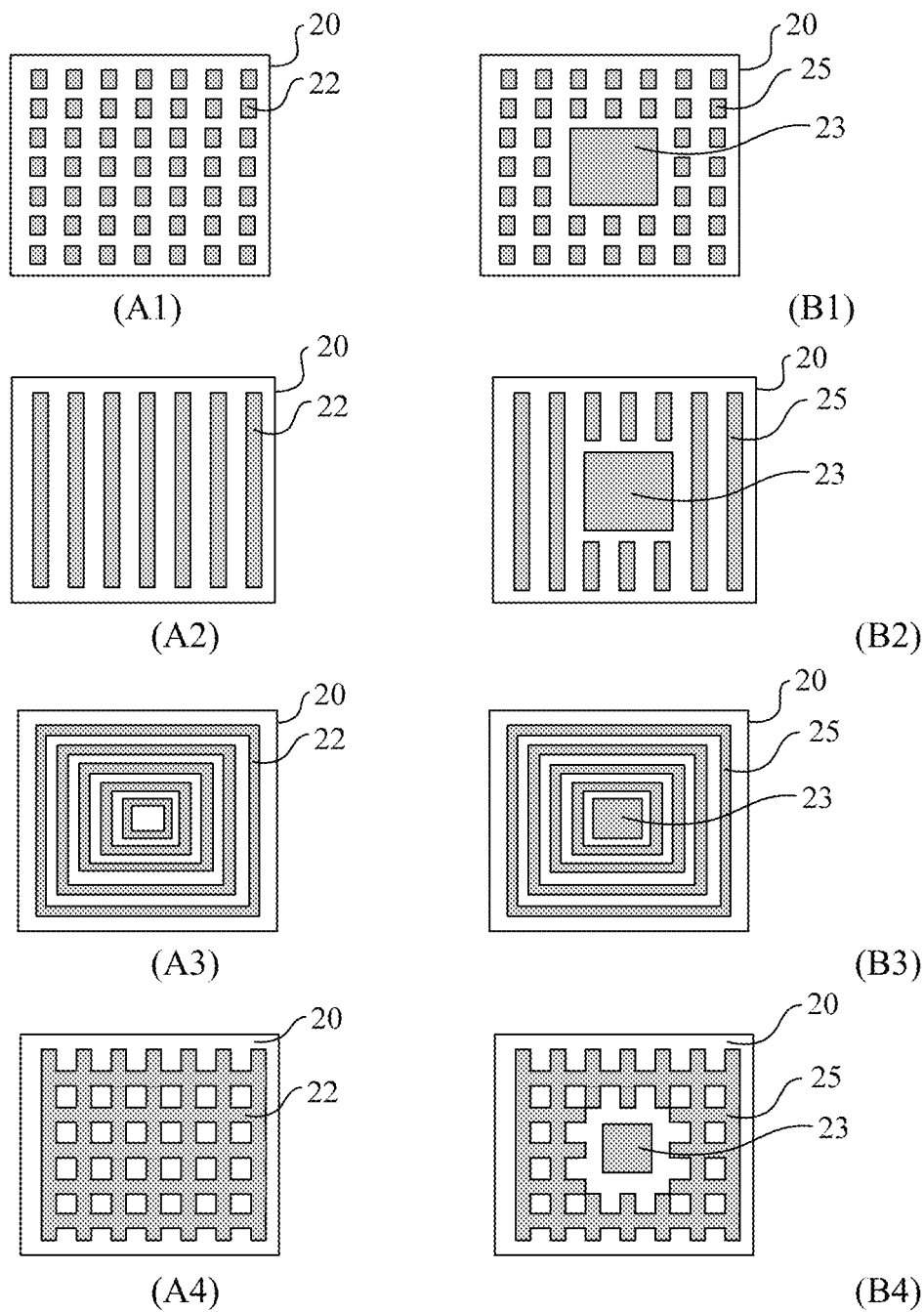

In step S03, a photoresist layer 140 is formed on the adhesion layer 130, a pattern of a mask is transferred to the photoresist layer 140 through photolithography. The pattern of the mask 20 includes a first pattern 22 and a second pattern 23. The first pattern 22 is a sub-resolution auxiliary pattern and corresponds to the non-lead-out region 1301. The second pattern 23 is exposable and corresponds to the lead-out region 1302. A first partial exposure region 142 is formed in the photoresist layer 140 above the non-lead-out region 1301, and is exposed partially in depth from the first pattern 22. An exposed pattern 143 of the second pattern 23 is formed in the photoresist layer 140 above the lead-out region 1302. Reference is made to FIGS. 3 to 5.

The photoresist layer 140 may be formed on the adhesion layer 130 by spin-coating a photoresist material. The photoresist material is a photosensitive material, and also called a photosensitive etchant, a photoresist, and the like. Then, the pattern in the mask is transferred to the photoresist layer 140 by using the photolithography via steps such as exposure and development.

In one embodiment, the pattern in the mask includes the first pattern that is a sub-resolution auxiliary pattern and a second pattern that is exposable. The sub-resolution auxiliary pattern includes tiny patterns that are densely distributed, and a size of a tiny pattern is smaller a resolution of a lithography machine. Therefore in exposure of the lithography, the tiny patterns scatter light and are not transferred to the photoresist layer. A region under the tiny patterns is partially exposed. Thereby, a region exposed partially in depth is formed in the photoresist layer, and corresponds to a region in which the sub-resolution auxiliary pattern is located. A size of the exposable pattern is greater than the resolution of the lithography machine. In the exposure of the lithography, the exposable pattern is transferred to the lithographic layer, to form a completely exposed pattern.

Reference is made to FIG. 3, FIG. 4 and FIG. 5. FIG. 5 is a partial top view of masks of different patterns. (A1) to (A4) are schematic diagrams of a region of a mask 20 corresponding to the non-lead-out region 1301, and (B1)-(B4) are schematic diagrams of a region of a mask 20 corresponding to the lead-out region 1302. In one embodiment as referring to FIG. 3, the first pattern 22 that is the sub-resolution auxiliary pattern may be disposed above the non-lead-out region 1301 correspondingly. In another embodiment as referring to FIG. 4, the pattern of the mask may further include a third pattern 25 that is another sub-resolution auxiliary pattern, the third pattern 25 corresponds to the lead-out region 1302, and the third pattern 25 surrounds the second pattern 23. A quantity of the second patterns 23 may be one or more. In a case that multiple second patterns 23 are included, each second pattern 23 may be surrounded by a third pattern 25. In such case, since the second pattern 23 is surrounded by the third pattern 25 and the third pattern 25 is a sub-resolution auxiliary pattern, a region of the photoresist layer 140 that corresponds to the third pattern 25 is not completely exposed after exposure in the photolithography. As shown in FIG. 4, an exposed pattern 143 that is completely exposed and a second partial exposure region 145 that is exposed partially in depth around the exposed pattern 143 are formed in the photoresist layer 140 at the lead-out region 1302.

Figure 5A:
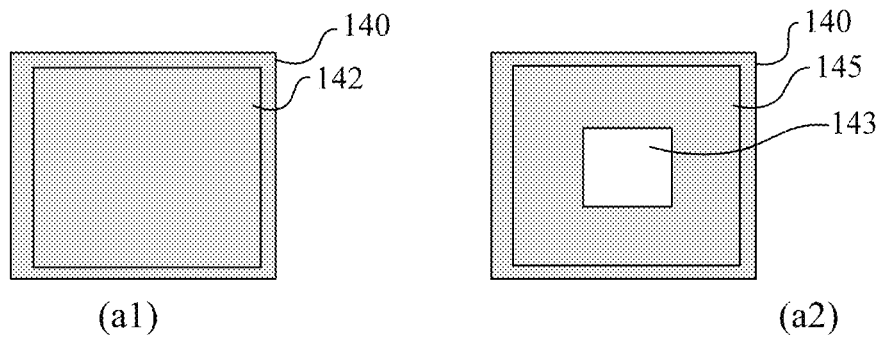

In one embodiment as referring to FIG. 5, the first pattern 22 and the third pattern 25 may be arranged in a lattice structure, a strip structure, a nested structure, or a crisscross structure. (A1) to (A4) in FIG. 5 show schematic diagrams of the first pattern 22 in a lattice structure, a strip structure, a nested structure, and a crisscross structure, respectively. (B1) to (B4) in FIG. 5 show schematic diagrams of the third pattern 25 in a lattice structure, a strip structure, a nested structure, and a crisscross structure, respectively, and the second pattern 23 is surrounded by the third pattern 25. In the lattice structure, an exposed region is configured as a block shape, the block may be quadrilateral or circular, and the quadrilateral may include a square or a rectangle. In the strip structure, an exposed region is distributed in a strip shape, and the strips may be same or different in length. In the nested structure, an exposed region is in a closed loop shape, the loops are different in radius and concentrically nested together, and the loops may be square or circular. In the crisscross structure, the region removed after exposure is intersected strips that are distributed in lateral and longitudinal directions. Since the first pattern 22 and the third pattern 25 are sub-resolution auxiliary patterns, the size of the tiny pattern is smaller than the resolution of the lithography machine, and the tiny pattern is not actually exposed to the photoresist layer 140. Referring to FIG. 5A, (a1) and (a2) in FIG. 5A are partial top views of the photoresist layers 140 above the non-lead-out region 1301 and the lead-out region 1302, respectively, after the photolithography is performed by using the mask 20. In conjunction with FIG. 4, the first partial exposure region 142 is formed in the photoresist layer 140 above the non-lead-out region 1301, and corresponds to a region in which the first pattern 22 is located. A second partial exposure region 145 is formed in the photoresist layer 140 at the lead-out region 1302, and corresponds to a region in which the third pattern 25 is located. The exposed pattern 143 that is completely exposed is formed in the photoresist layer 140 at the lead-out region 1302, and corresponds to the second pattern 23.

The aforementioned patterns for etching are formed by developing the pattern in the mask to the photoresist layer 140, through the photolithography. In mask design, different patterns for etching are realized in designing the mask, and a quantity of masks determines a process cost for entire device manufacturing. The aforementioned patterns for etching may be designed in one mask, so that the aforementioned patterns etched with different depths are formed in the photoresist layer in the photolithography by using the one mask. In such case, steps of the photolithography can be reduced, the cost of manufacturing can be reduced, and an integration degree of processes can be improved.

Figure 7:
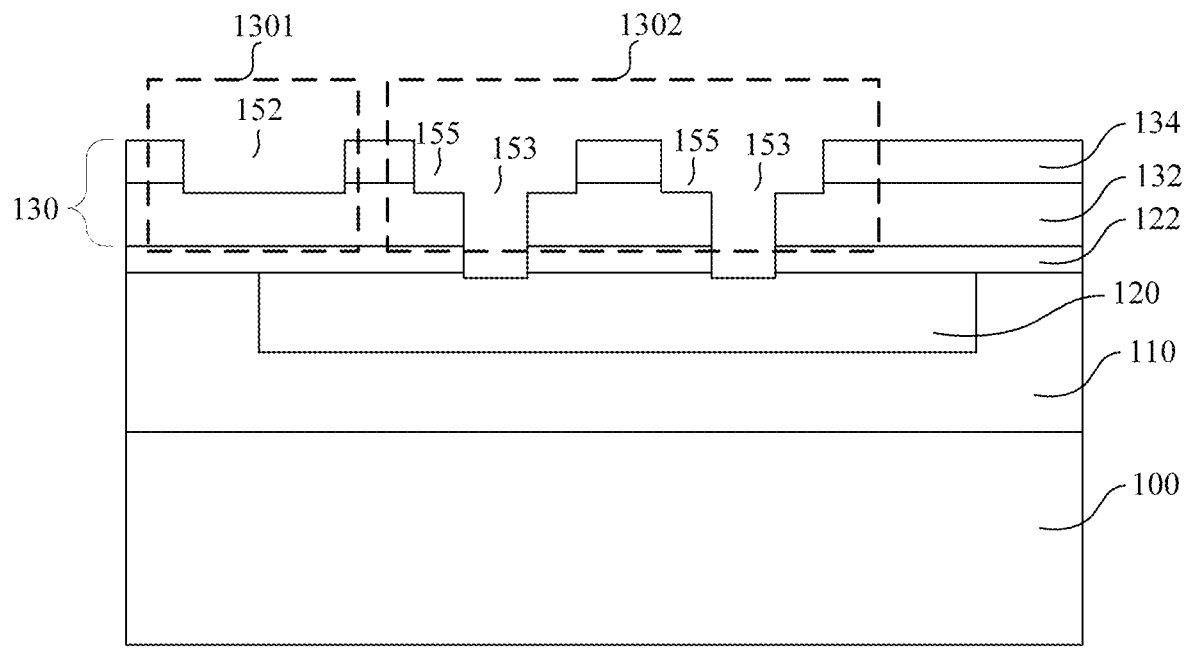

In step S04, an anisotropic etching is performed on the adhesion layer 130 by using the photoresist layer 140, to form both a first opening 152 and a via hole 153 in the adhesion layer 130, where the first opening 152 is under the first partial exposure region 142 and runs through a partial thickness of the adhesion layer 130, and the via hole 153 is under the exposed pattern 143 and runs through the adhesion layer 130 to the top wiring layer 120, as shown in FIG. 7.

In such step, a necessary pattern for etching has been formed in the photoresist layer 140. Further, the pattern for etching may be transferred to the adhesion layer 130 by using the photoresist layer 140 in the etching. The etching is anisotropic, thereby the anisotropic etching may be, for example, reactive ion etching (RIE), and the anisotropic etching is mainly along a direction perpendicular to the substrate. During the etching, the patterns for etching have different depths. Hence, the adhesion layer 130 under the exposed pattern 143 is etched first. The photoresist layer 140 of a partial thickness still remains under the first partial exposure region 142 and the second partial exposure region 145. During the etching, the photoresist layer 140 of the partial thickness is removed first, and then the adhesion layer 130 under the first partial exposure region 142 and the second partial exposure region 145 are etched. Therefore, when the adhesion layer 130 under the exposed pattern 143 is completely etched to the top wiring layer 120 to form the via hole 153, the adhesion layer 130 under the first partial exposure region 142 and the second partial exposure region 145 is not penetrated. Thereby, the first opening 152 and the second opening 155 are formed respectively, and the adhesion layer 130 of a partial thickness remains under the first opening 152 and the second opening 155. In a subsequent process of filling the via hole 153 and planarization, the first opening 152 and the second opening 155 are configured to balance a load in the planarization.

Figure 6:
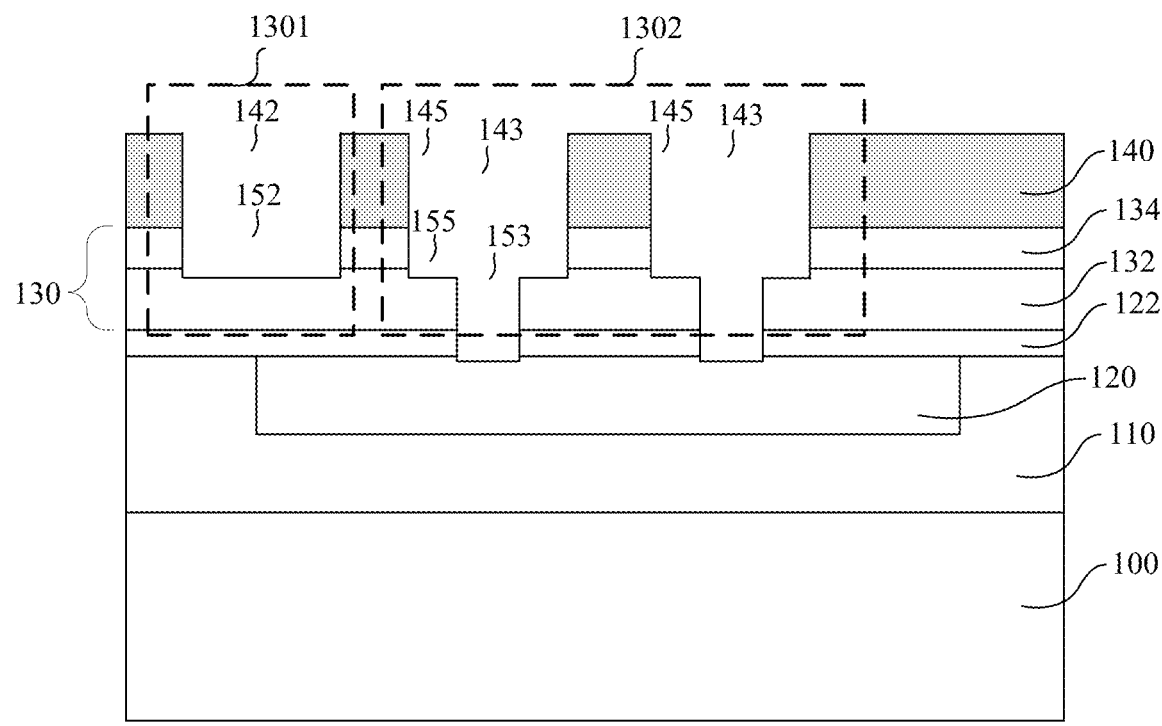

In one embodiment, in the anisotropic etching, the adhesion layer 130 may be etched by directly using the photoresist layer 140 as a mask, so as to sequentially transfer the pattern for etching in the photoresist layer 140 to the adhesion layer 140, as shown in FIG. 6. Afterwards, the photoresist layer 140 may be removed, as shown in FIG. 7.

In other embodiments, a hard mask layer (not shown in the figure) may be formed before the photoresist layer 140 is formed. The hard mask layer may be, for example, a dielectric material such as silicon oxide, silicon nitride, silicon oxynitride, or a lamination thereof. The pattern for etching in the photoresist layer 140 is first transferred to the hard mask layer, and then the adhesion layer 130 is etched by using the hard mask layer. Thereby, the pattern for etching is indirectly transferred to the adhesion layer 140. Afterwards, the photoresist layer 140 and the hard mask layer may be removed.

A density and a size of the first pattern (or, further the third pattern) with respect to the second pattern may be adjusted based on a requirement of a specific design. Thereby in etching the adhesion layer, the via hole may be formed under the second pattern, and the opening with a required depth may be formed under the first pattern and the third pattern.

Figure 9:
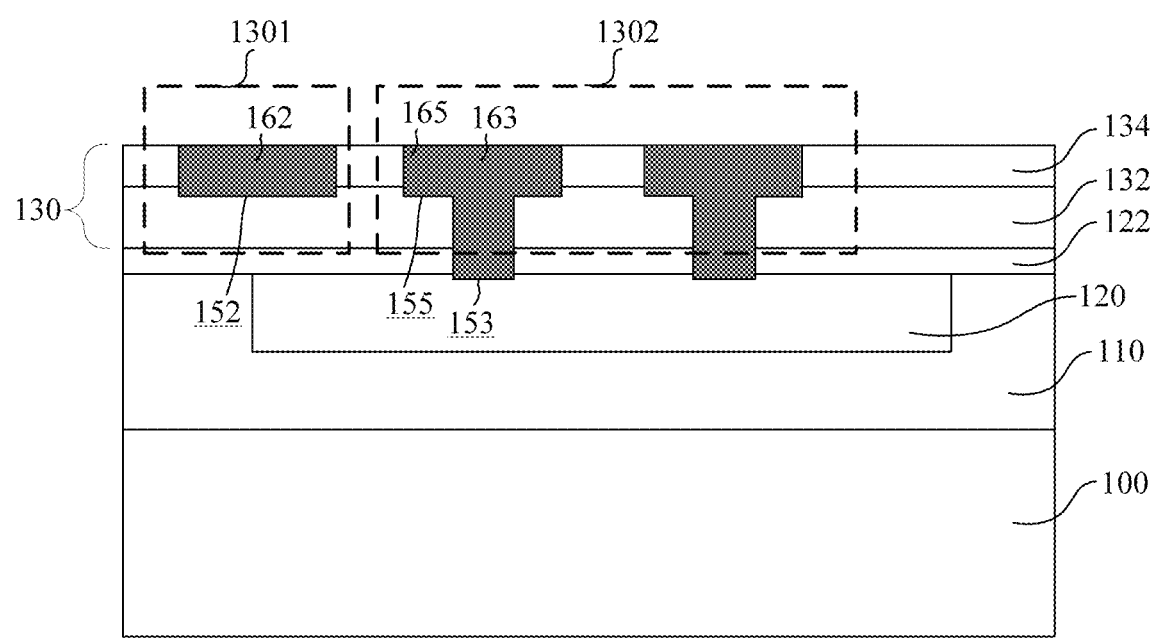

In step S05, the first opening and the via hole is filled with a conductive material 160, where the conductive material is planarized, as shown in FIG. 9.

Figure 8:
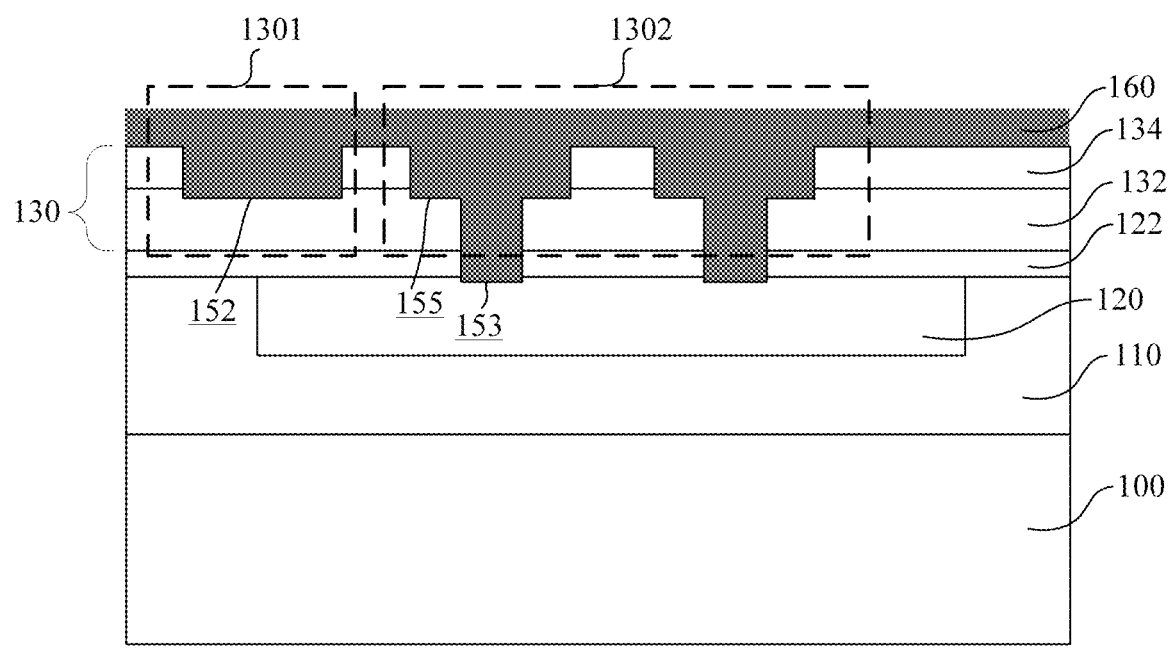

After the photoresist layer is removed, the via hole 153, the first opening 152 and the second opening 155 are all filled with the conductive material 160 in a filling process. The conductive material 160 may be a metal material, such as copper or tungsten. The conductive material 160 is also formed above the adhesion layer 130, the via hole 153, openings 152 and 155, as shown in FIG. 8. In planarization such a CMP process, only the conductive material within the via hole and the opening are remained, and the conductive material outside the adhesion layer 130, the via hole and the opening are removed in the planarization.

The sub-resolution pattern is formed both in the non-lead-out region 1301, and around the second pattern in the lead-out region 1302. Thereby, when the via hole 153 for lead-out is formed, and the opening 152 and the opening 155 are formed in the non-lead-out region 1301 and the lead-out region 1302, respectively. The conductive material in such openings is configured to balance the load in the planarization, avoid a defect in the planarization, improve a performance of the device, and reduce a cost for manufacturing.

After the planarization, a lead-out hole 163 for the top wiring layer 120 is formed at the via hole 153, and a first non-lead-out layer 162 and a second non-lead-out layer 165 are formed at the first opening 152 and the second opening 155, respectively, as shown in FIG. 9.

Based on the above, the semiconductor device according to an embodiment of the present disclosure is formed. Afterwards, the wafer on which the semiconductor device is formed may be further bonded to another wafer, so as to form a bonding structure. The bonding structure is cut, so that a chip structure provided with the aforementioned semiconductor device is formed.

In addition, a semiconductor device is further provided according to an embodiment of the present disclosure, as shown in FIG. 9. The semiconductor device may be formed by the aforementioned method. The semiconductor device includes a substrate 100, a cover layer 110, a top wiring layer 120, an adhesion layer 130, a first non-lead-out layer 162, and a lead-out hole 163.

The cover layer 110 made of a dielectric material is on the substrate 100. The top wiring layer 120 is within the cover layer 110.

The adhesion layer 130 is on the cover layer 110 and the top wiring layer 120. The adhesion layer 130 includes a lead-out region 1302 and a non-lead-out region 1301. The lead-out region 1302 is located above the top wiring layer 120;

The first non-lead-out layer 162 is located within the adhesion layer 130 at the non-lead out region 1301, and is smaller than the adhesion layer 130 in thickness. The first non-lead-out layer 162 includes a first opening 152 and a conductive material in the first opening 152;

The lead-out hole 163 is in the adhesion layer 130 and runs through the lead-out region 1302. The lead-out hole 163 includes a via hole 153 and a conductive material in the via hole 153, and the via hole 153 runs through the lead-out region 1302 to the top wiring layer 120.

Further, the semiconductor device includes a second non-lead-out layer 165 located within the adhesion layer 130 at the lead-out region 1302. The second non-lead-out layer 165 includes a second opening 155 and a conductive material in the second opening 155, and the second opening 155 surrounds the via hole 153.

Further, a quantity of the via holes 153 is more than one.

Further, the adhesion layer 130 includes at least one of a silicon oxide layer, an NDC layer, or a lamination thereof.

In addition, reference is made to FIG. 4 and FIG. 5. A mask is further provided according to an embodiment of the present disclosure, and may be applied to the aforementioned method. The mask is applied to photolithography for forming a via hole for leading out a top wiring layer. A pattern of the mask 20 includes a first pattern 22 and a second pattern 23. The first pattern 22 is a sub-resolution auxiliary pattern and corresponds to a non-lead-out region. The second pattern 23 is exposable and corresponds to a lead-out region. The lead-out region corresponds to a region in which the top wiring layer is located.

Further, the pattern of the mask 20 includes a third pattern 25. The third pattern 25 is a sub-resolution auxiliary pattern and corresponds to the lead-out region, and the third pattern 25 surrounds the second pattern 23.

Further, an arrangement of the first pattern 23 or the third pattern 25 includes at least one of a lattice structure, a strip structure, a nested structure, or a crisscross structure.

The embodiments of the present disclosure are described in a progressive manner, and each embodiment places emphasis on the difference from other embodiments.

Therefore, one embodiment can refer to other embodiments for the same or similar parts. Since devices disclosed in the embodiments correspond to methods disclosed in the embodiments, the description of the devices is simple, and reference may be made to the relevant part of the methods.

The foregoing embodiments are only preferred embodiments of the present disclosure, and do not limit the present disclosure in any form. The preferred embodiments according to the disclosure are disclosed above, and are not intended to limit the present disclosure. With the method and technical content disclosed above, those skilled in the art can make some variations and improvements to the technical solutions of the present disclosure, or make some equivalent variations on the embodiments without departing from the scope of technical solutions of the present disclosure. All simple modifications, equivalent variations and improvements made based on the technical essence of the present disclosure without departing the content of the technical solutions of the present disclosure fall within the protection scope of the technical solutions of the present disclosure.

The invention claimed is:

1. A method for manufacturing a semiconductor device, comprising:
   providing a substrate;
   forming a cover layer made of a dielectric material on the substrate;
   forming a top wiring layer within the cover layer;
   forming an adhesion layer on the cover layer, wherein the adhesion layer comprises a lead-out region and a non-lead-out region, and the lead-out region is located above the top wiring layer;
   forming a photoresist layer on the adhesion layer;
   transferring a pattern of a mask to the photoresist layer through photolithography, wherein:
      the pattern of the mask comprises a first pattern and a second pattern;
      the first pattern is a sub-resolution auxiliary pattern and corresponds to the non-lead-out region;
      the second pattern is exposable and corresponds to the lead-out region;
      a first partial exposure region is formed in the photoresist layer above the non-lead-out region, and the first partial exposure region is exposed partially in depth from the first pattern, and
      an exposed pattern of the second pattern is formed in the photoresist layer above the lead-out region;
   performing anisotropic etching on the adhesion layer by using the photoresist layer, to form both a first opening and a via hole in the adhesion layer, wherein:
      the first opening is under the first partial exposure region, and runs through a partial thickness of the adhesion layer, and
      the via hole is under the exposed pattern, and runs through the adhesion layer to the top wiring layer; and
   filling the first opening and the via hole with a conductive material, wherein the conductive material is planarized.

2. The method according to claim 1,
   wherein the pattern of the mask further comprises a third pattern, the third pattern is another sub-resolution auxiliary pattern and corresponds to the lead-out region, and the third pattern surrounds the second pattern;
   wherein a second partial exposure region is further formed in the photoresist layer above the lead-out region in the photolithography, and the second partial exposure region is exposed partially in depth from the third pattern; and
   wherein a second opening is further formed in performing the anisotropic etching on the adhesion layer, the second opening is under the second partial exposure region, and the second opening runs through another partial thickness of the adhesion layer.

3. The method according to claim 2, wherein an arrangement of the first pattern or the third pattern comprises at least one of:
   a lattice structure, a strip structure, a nested structure, or a crisscross structure.

4. The method according to claim 1, wherein a quantity of the second pattern is more than one.

5. The method according to claim 1, wherein the adhesion layer comprises at least one of:

a silicon oxide layer, an NDC (nitrogen doped silicon carbide) layer, or a lamination of a silicon oxide layer and an NDC layer.

6. A semiconductor device formed by the method according to claim 1, comprising:
the substrate;
the cover layer on the substrate, made of the dielectric material;
the top wiring layer within the cover layer;
the adhesion layer on the cover layer, comprising the lead-out region and the non lead-out region, wherein the lead-out region is located above the top wiring layer;
a first non-lead-out layer, located within the adhesion layer at the non-lead out region, wherein the first non-lead-out layer is smaller than the adhesion layer in thickness, and the first non-lead-out layer comprises the first opening and the conductive material in the first opening; and
a lead-out hole in the adhesion layer, wherein the lead-out hole runs through the lead-out region, the lead-out hole comprises the via hole and the conductive material in the via hole, and the via hole runs through the lead-out region to the top wiring layer.

7. The device according to claim 6, wherein further comprising:
a second non-lead-out layer, located within the adhesion layer at the lead out region, wherein the second non-lead-out layer is smaller than the adhesion layer in thickness, the second non-lead-out layer comprises a second opening and a conductive material in the second opening, and the second opening surrounds the via hole.

8. The device according to claim 6, wherein a quantity of the via hole is more than one.

9. The device according to claim 6, wherein the adhesion layer comprises at least one of:
a silicon oxide layer, an NDC (nitrogen doped silicon carbide) layer, or a lamination of a silicon oxide layer and an NDC layer.

10. A mask, used for the method according to claim 1 and applied to photolithography for forming the via hole for leading out the top wiring layer, wherein:
the pattern of the mask comprises the first pattern and the second pattern;
the first pattern is the sub-resolution auxiliary pattern and corresponds to the non-lead-out region;
the second pattern is exposable and corresponds to the lead-out region; and
the lead-out region corresponds to a region in which the top wiring layer is located.

11. The mask according to claim 10, wherein:
the pattern of the mask further comprises a third pattern;
the third pattern is another sub-resolution auxiliary pattern and corresponds to the lead-out region, and
the third pattern surrounds the second pattern.

12. The mask according to claim 11, wherein an arrangement of the first pattern or the third pattern comprises at least one of:
a lattice structure, a strip structure, a nested structure, or a crisscross structure.

* * * * *